United States Patent [19]
Okada

[11] Patent Number: 5,182,515
[45] Date of Patent: Jan. 26, 1993

[54] DETECTOR FOR MAGNETISM USING A RESISTANCE ELEMENT

[75] Inventor: Kazuhiro Okada, Ageo, Japan
[73] Assignee: Wacoh Corporation, Ageo, Japan
[21] Appl. No.: 559,381
[22] Filed: Jul. 25, 1990

Related U.S. Application Data

[62] Division of Ser. No. 295,210, filed as PCT/JP88/00395 on Apr. 22, 1988, Pat. No. 4,967,605.

[30] Foreign Application Priority Data

Apr. 24, 1987 [JP] Japan .................. 62-101267
Apr. 24, 1987 [JP] Japan .................. 62-101269

[51] Int. Cl.$^5$ .................................... G01R 33/02
[52] U.S. Cl. ........................ 324/259; 324/260; 73/DIG 10; 73/862.041
[58] Field of Search .......... 73/862.04, 862.67, 862.68, 73/777, 517 R, DIG. 10; 324/259, 260

[56] References Cited

U.S. PATENT DOCUMENTS

| | | | |
|---|---|---|---|
| 2,767,974 | 10/1956 | Ballard et al. | 73/DIG. 10 |
| 4,373,399 | 2/1983 | Beloglazov et al. | 73/777 |
| 4,454,771 | 6/1984 | Shimazoe et al. | 73/862.68 |
| 4,680,544 | 7/1987 | Rudolf | 324/259 |
| 4,891,985 | 1/1990 | Glenn | 73/517 R |

FOREIGN PATENT DOCUMENTS 0223625 10/1986 Japan ................... 73/862.04

*Primary Examiner*—Michael Razavi
*Assistant Examiner*—E. Shopbell
*Attorney, Agent, or Firm*—Ladas & Parry

[57] ABSTRACT

A force detector is comprised of resistance elements having a piezo resistance effect such that electric resistance varies due to mechanical deformation, and formed on a single crystal substrate (10), and a strain generative body (20) having a supporting portion (21) and a working portion (23), thus allowing the resistance elements to produce a mechanical deformation on the basis of a displacement with respect to the supporting portion of the working portion. This force detector can detect a force applied to the working portion as changes in resistance values of the resistance elements. The plane on which resistance elements are to be formed on the single crystal substrate is selected so that piezo resistance coefficients in two directions perpendicular to each other exhibit peak. When a weight body (30) is connected to the working portion, it is possible to detect an acceleration acting on the weight body. Moreover, when a magnetic body (330) is connected to the working portion, it is possible to detect a nagnetic force acting on the magnetic body. By using the detector system for acceleration in common to the detector system for magnetic force to perform a compensation computation, detection of a magnetic force which is not influences by acceleration can be made. By devising an arerangement of resistance elements in either detector, it is possible to independently determine magnitudes of objects to be measured with respect to directions of the three-dimensional coordinate system, respectively.

6 Claims, 14 Drawing Sheets

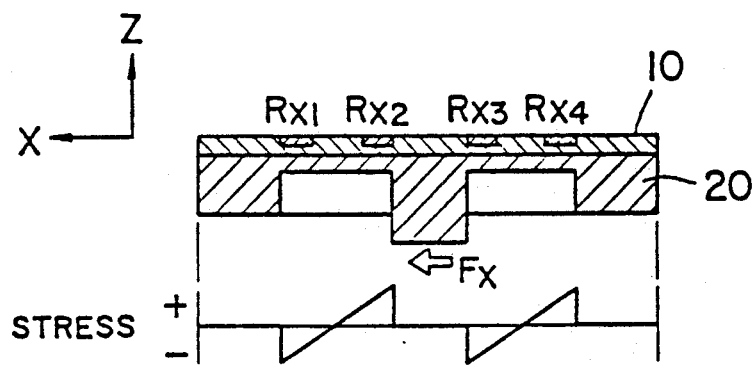
F I G. 4 (a)
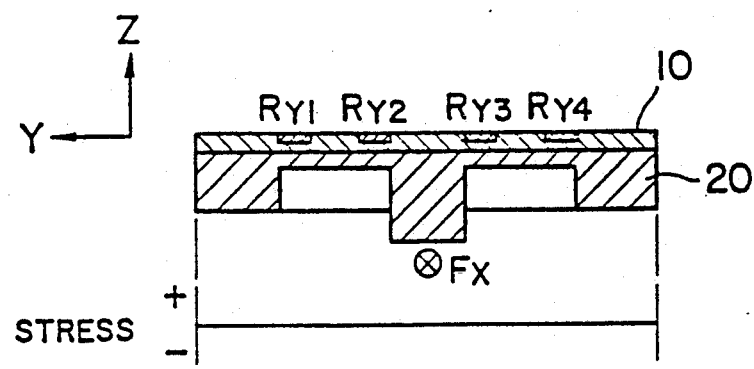
F I G. 4 (b)
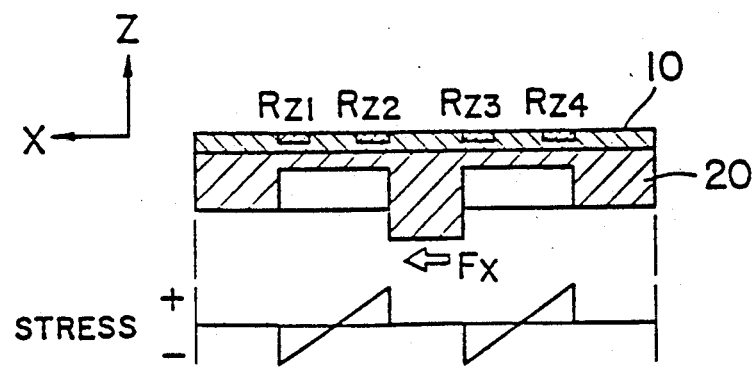
F I G. 4 (c)

DETECTOR FOR MAGNETISM USING A RESISTANCE ELEMENT

This is a divisional of copending applications Ser. No. 07/295,210 filed Dec. 19, 1988 now U.S. Pat. No. 4,967,605, and International Application PCT/JP88/00395 filed on Apr. 22, 1988 and which designated the U.S.

FIELD OF THE ART

This invention relates to a force detector using a resistance element, and an acceleration detector and a magnetism detector to which the force detector is applied, and more particularly to a detector capable of detecting force, acceleration and magnetism respectively applied in independent directions in the three-dimensional coordinate system.

BACKGROUND ART

In the case of detecting a force applied in a three-dimensional space, there occurs a need to independently detect respective axial components of the applied force in the three-dimensional coordinate system expressed by three axes of X, Y and Z. Conventional force detectors generally used convert a stress-strain resulting from an applied force to a quantity of electricity using a strain gauge, etc. to thereby conduct a detection. Ordinarily, there are many instances where a strain gauge is stuck on a strain generative body processed in three dimensions to detect stress-strain in respective directions of X, Y and Z axes of the strain generative body to thereby make a detection of force.

In various industrial equipments with motion including robot, detection of acceleration in the three-dimensional coordinate system is required. Namely, there occurs a need to independently detect respective axial direction components of acceleration in the three dimensional coordinate system represented with three axes of X, Y and Z. Conventional acceleration detectors generally used convert a stress-strain resulting from an acceleration to a quantity of electricity using a strain gauge to thereby conduct a detection. Ordinarily, there are many instances where a strain gauge is stuck on a structure of a cantilever to make a detection of acceleration in a specified direction by a strain due to stress of the cantilever in the same manner as in the above-described force detector.

However, the above-described conventional force detector and acceleration detector have the problem that the structure is complicated and is therefore not suitable for mass production. For example, three sets of cantilevers must be combined in three dimensions in order to detect three axial direction components in an apparatus using a structure of cantilever. Accordingly, there occurs the problem that such an apparatus is not suitable for mass production and becomes costly. Further, because a sensor such as a strain gauge is used in prior art apparatus, there is the problem that measurement accuracy is low.

On one hand, Hall element and magneto-resistance effect element, etc. are known as the magnetism detector. Hall element is generally comprised of a rectangular semiconductor thin plate. When a bias current is caused to flow in a length direction of the semiconductor thin plate to produce a magnetic field in a direction normal to the bias current, an electromotive force proportional to the magnetic field is produced normal to both the bias current and the magnetic force by Lorentz force. By detecting this electromotive force, the magnitude of the magnetic field is recognized. On the other hand, in the case of magneto-resistance effect element, when a magnetic field is applied to the magneto-resistance effect element in which a current is flowing, a passage of carrier is elongated by Lorentz force, resulting in an increase in electric resistance. By detecting this electric resistance, the magnitude of the magnetic field is recognized.

However, Hall element or magneto-resistance effect element as described above has the problem that it is difficult to precisely detect the direction of magnetic field although the magnitude of the magnetic field can be easily detected.

DISCLOSURE OF THE INVENTION

A first object of this invention is to provide a force detector which is simple in structure and is suitable for mass production, and which is capable of making a high accuracy measurement.

A second object of this invention is to provide an acceleration detector which is simple in structure and is suitable for mass production, and which is capable of making a high accuracy measurement.

A third object of this invention is to provide a magnetism detector capable of precisely detecting not only the magnitude of a magnetic field but also the direction thereof.

This invention has attained the above-described objects by the following features.

In a force detector, the first feature of this invention resides in that resistance elements having the piezo resistance effect that electric resistance changes due to mechanical deformation are formed on a single crystal substrate to connect a strain generative body having a supporting portion and a working portion thereto to allow the resistance elements to produce a mechanical deformation on the basis of a displacement with respect to the supporting portion of the working portion, thus to electrically detect a force acting on the working portion. When a force is applied to the working portion of the force detector according to this invention, there occurs a change in the electric resistance based on mechanical deformation by piezo resistance effect, thus making it possible to electrically detect the force applied. Since all the resistance elements are formed on one surface of the single crystal substrate, the structure extremely becomes simplified. Thus, the force detector becomes suitable for mass production.

In the above-described force detector, the second feature of this invention resides in that a plane on which resistance elements are to be formed is selected so that piezo resistance coefficients in two directions substantially orthogonal to each other on the plane on which resistance elements are to be formed exhibit substantially peak. Since two directions in which piezo resistance coefficients exhibit peak are substantially orthogonal to each other on the resistance element formation plane, two directions which exhibit peak can be taken as a detection axis of force. Thus, measurement having good sensitivity can be conducted, resulting in an improvement in measurement accuracy.

The third feature of this invention resides in that a weight body for producing a displacement corresponding to an acceleration is connected to the working portion of the strain generative body in the above-described force detector, thus to constitute an acceleration detector.

The fourth feature of this invention resides in that a magnetic body for producing a displacement corresponding to an ambient magnetic field is connected to the working portion of the strain generative body in the above-described force detector, thus to constitute a magnetism detector.

The fifth feature of this invention is to make two sets of magnetism detectors described above by using different magnetic bodies consisting of materials having magnetic properties different from each other, thus making it possible to conduct a precise measurement of magnetic physical quantity from which the influence of acceleration is excluded on the basis of both results detected.

BRIEF DESCRIPTION OF THE DRAWINGS

FIGS. 4(a), 4(b), and 4(c), 5(a), 5(b), 5(c), and 6(a), 6(b), and 6(c) are views showing stress produced when force is applied in X-, Y- and Z-axis directions in the device shown in FIGS. 1(a) and 1(b), respectively;

BEST MODE FOR CARRYING OUT THE INVENTION

Figure 1A:
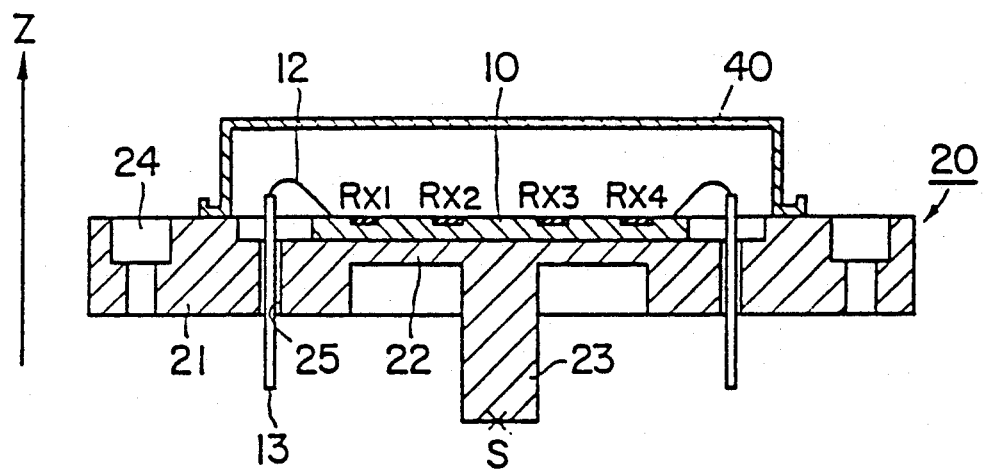
FIGS. 1(a) and 1(b) are a side cross sectional view and a plan view of a force detector according to an embodiment of this invention, respectively.
Figure 1B:
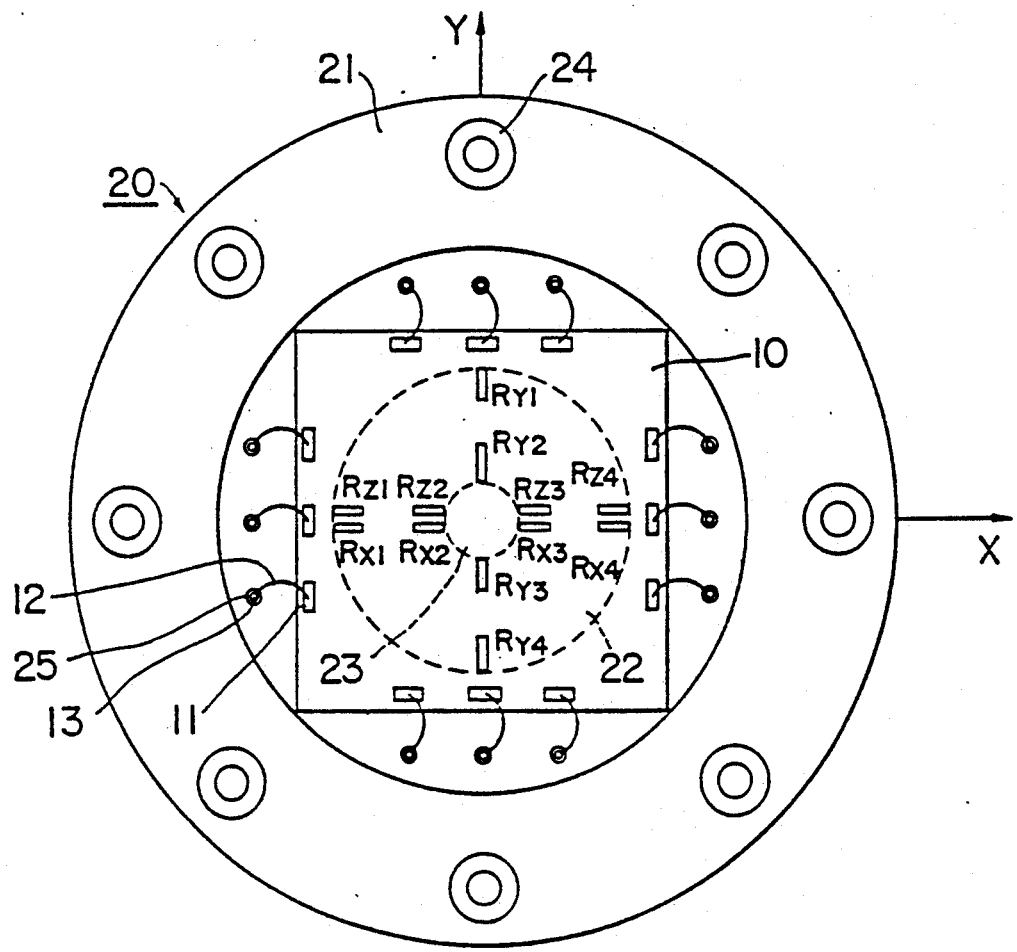

§1. Most preferred embodiment of a force detector 1.1 Configuration of the detector FIG. 1(a) is a side cross sectional view of a force detector according to an embodiment of this invention, and FIG. 1(b) is a top view of the detector wherein X-, Y- and Z-axis are defined so that they correspond to respective directions in the figure. FIG. 1(a) corresponds to the cross sectional view cut along the X-axis of the detector shown in FIG. 1(b).

In this detector, 12 resistance elements R in total are formed on a silicon single crystal substrate 10. Resistance elements Rx1 to Rx4 are arranged on the X-axis and are used for detecting force in the X-axis direction. Moreover, resistance elements Ry1 to Ry4 are arranged on the Y-axis and are used for detecting force in the Y-axis direction. In addition, resistance elements Rz1 to Rz4 are arranged on an axis parallel to the X-axis and in the vicinity thereof and are used for detecting force in the Z-axis direction. Actual structure of respective resistance elements R and the manufacturing method thereof will be described in detail. These resistance elements R are an element having piezo resistance effect of which electric resistance changes depending upon mechanical deformation.

The single crystal substrate 10 is adhered to a strain generative body 20. In the detector according to this embodiment, the strain generative body 20 is composed of a disk-shaped flange portion 21, a flexible portion 22 of which thickness is formed to be thin so as to have flexibility, and a projection 23 projected in the center. For material of the strain generative body 20, Kovar (alloy of iron, cobalt and nickel) is used. Because Kovar has substantially the same order of coefficient of thermal expansion as that of the silicon single crystal substrate 10, Kovar has the merit that thermal stress produced by temperature change is extremely small even if it is adhered to the single crystal substrate 10. The material and the form of the strain generative body 20 are not limited to the above. Namely, the embodiment shown here is only the most suitable mode. In the above-embodiment, the strain generative body 20 is fixed to a predetermined supporting body by means of fitting holes 24.

A protective cover 40 for protecting the single crystal substrate 10 is affixed above the strain generative body 20 (an indication thereof is omitted in FIG. 1(b)). Any protective cover may be used for the protective cover 40 as long as it has a protective function. The provision of such a protective cover may be omitted in dependence upon the mode in use of the detector.

Figure 2A:
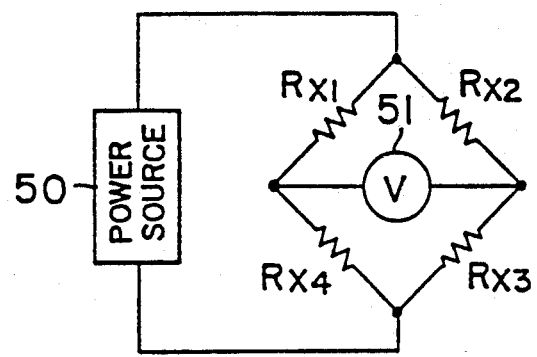
FIGS. 2(a), 2(b) and 2(c) are circuit diagrams showing the bridge configuration of resistance elements of the detector shown in FIGS. 1(a) and 1(b).
Figure 2B:
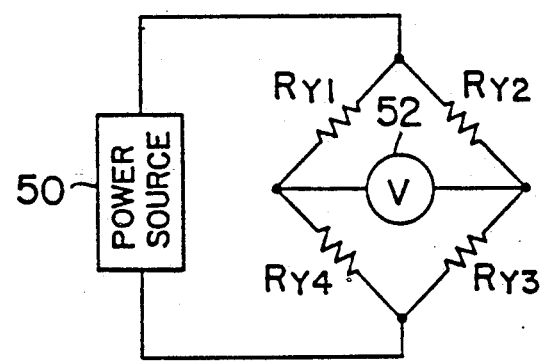
Figure 2C:
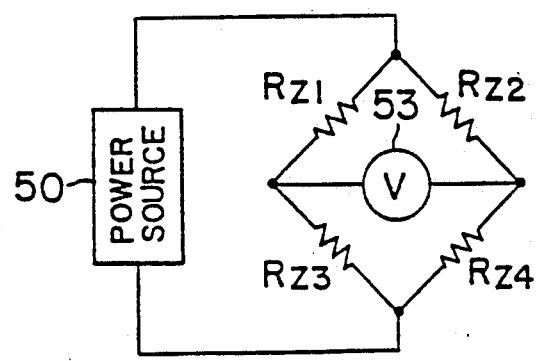

Wiring as shown in FIGS. 2(a), 2(b) and 2(c) is implemented to respective resistance elements. Namely, resistance elements Rx1 to Rx4 are assembled as a bridge circuit as shown in FIG. 2(a), resistance elements Ry1 to Ry4 are assembled as a bridge circuit as shown in FIG. 2(b), and resistance elements Rz1 to Rz4 are assembled as a bridge circuit as shown in FIG. 2(c). A predetermined voltage or current is delivered from a power source 50 to respective bridge circuits. Respective bridge voltages are measured by voltage meters 51 to 53. For implementing such a wiring to respective resistance elements R, as shown in FIGS. 1(a) and 1(b) bonding pads 11, which are electrically connected to respective resistance elements R, and electrodes 13, which are used for external wiring, are connected by bonding wires 12 on the single crystal substrate 10. These electrodes 13 are drawn out to the outside through wiring holes 25.

It is to be noted that while the strain generative body 20 and the single crystal substrate 10 are separately provided in the above-described embodiment, if the strain generative body 20 is comprised of single crystal, both the members may be integrally formed.

1.2 Fundamental principle of the detector

When a force is applied to the working point S of the projection 23 tip in FIG. 1(a), a strain due to stress corresponding to the force applied is produced in the strain generative body 20. Since the flexible portion 22 has thin thickness and has flexibility as described above, a displacement is produced between the center (hereinafter referred to as a working portion) and the peripheral portion (hereinafter referred to as a supporting portion) of the strain generative body, so that respective resistance elements R will be mechanically deformed. An electric resistance of each resistance element R varies by this deformation. Eventually, a force applied is detected as a change of each bridge voltage shown in FIGS. 2(a), 2(b) and 2(c).

Figure 3A:
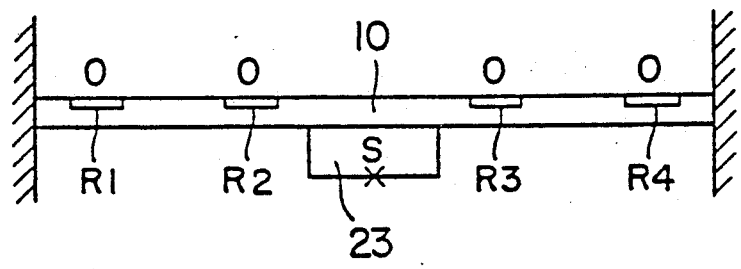
FIGS. 3(a), 3(b) and 3(c) are diagrams of principle showing the relationship between strain due to stress and resistance change of resistance elements in the device shown in FIGS. 1(a) and 1(b).

The relationship between stress-strain and changes in the electric resistance of resistance elements R is shown. Here, for convenience of explanation, only the single crystal substrate 10 and the projection 23 of the strain generative body 20 are shown, and the case that four resistance elements R1 to R4 are formed from the left to the right in the figure is taken. Initially, when no force is applied to the working point S as shown in FIG. 3(a), stress-strain is not applied to the single crystal substrate 10. The resistance changes of all the resistance elements are equal to zero. On the contrary, when a force F1 in a lower direction is applied, the single crystal substrate 10 will be mechanically deformed. When it is assumed that the conductivity of each resistance element is of P-type, resistance elements R1 and R4 expand by this deformation, resulting in an increase in resistance (indicated by plus sign), while resistance elements R2 and R3 contract also by such a deformation, resulting in a decrease in resistance (indicated by minus sign). In contrast, when a force F2 in a right direction is applied, the single crystal substrate 10 is mechanically deformed as shown (actually, the force F2 acts as a moment force on the single crystal substrate 10). By this deformation resistance elements R1 and R3 expand, resulting in an increase in resistance, while resistance elements R2 and R4 contract, resulting in a decrease in resistance. It is to be noted that because respective resistance elements are resistance elements such that the lateral direction in the figure is taken as their length direction, when a force is applied perpendicular to the paper plane on which the figure is depicted, changes in resistance of respective resistance elements are all negligible. As just described above, this device independently forces in respective directions by making use of the fact that the resistance change characteristic of the resistance elements varies depending upon the direction of an applied force.

1.3 Operation of the detector

Figure 5A:
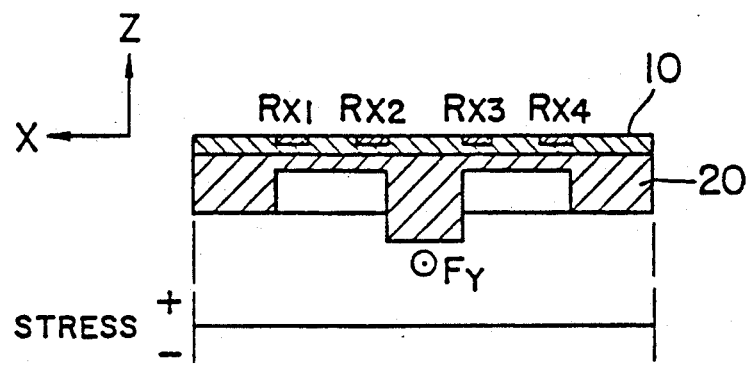
Figure 5B:
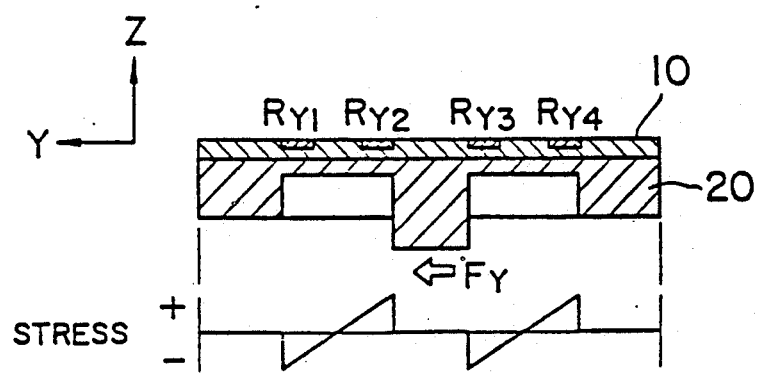
Figure 5C:
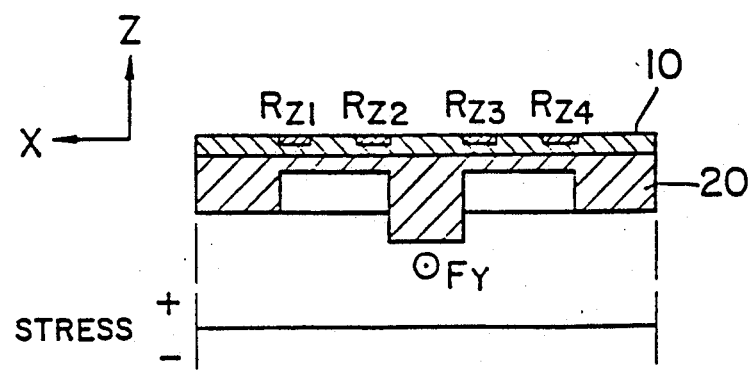
Figure 6A:
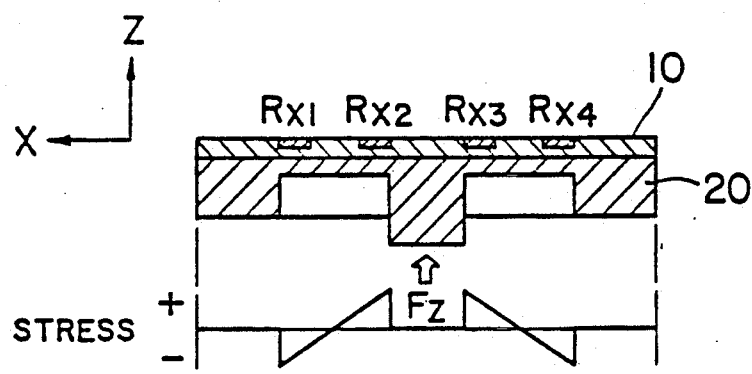
Figure 6B:
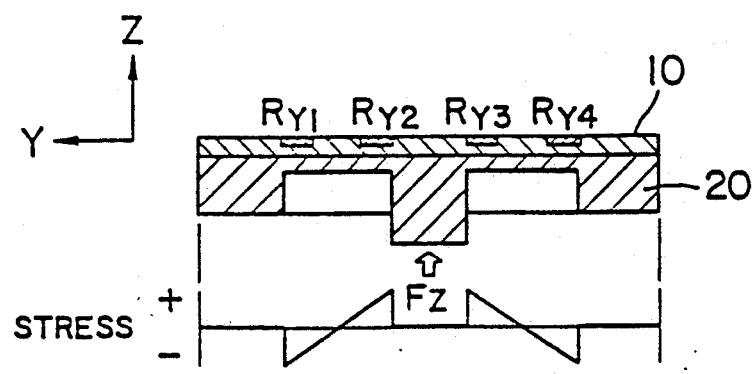
Figure 6C:
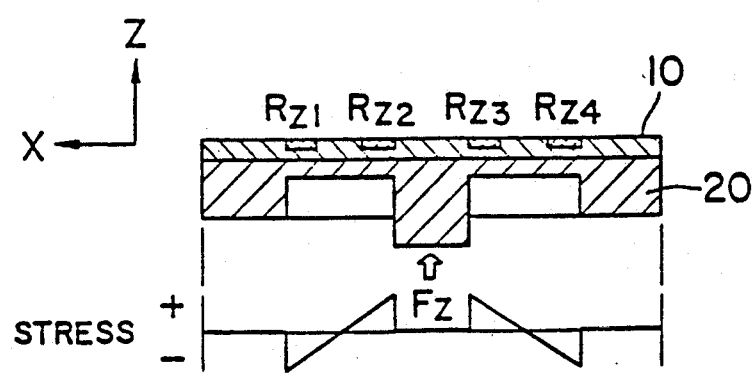
Figure 7A:
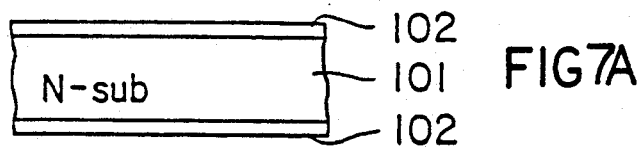
FIGS. 7(a)-(g) is a sequence diagram of a process for forming resistance elements used for the device shown in FIGS. 1(a) and 1(b) on a single crystal substrate.
Figure 7B:
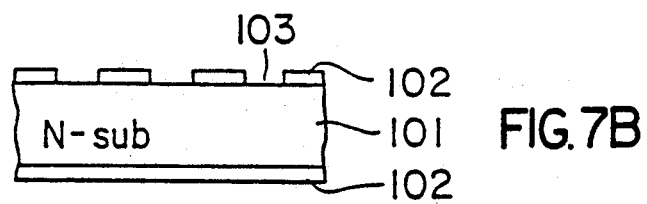
Figure 7C:
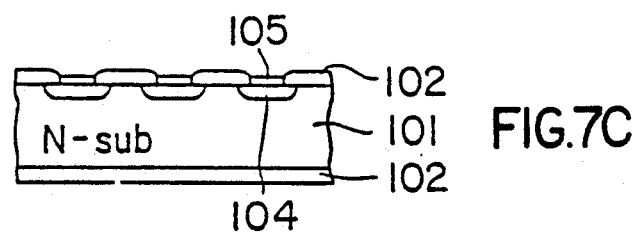
Figure 7D:
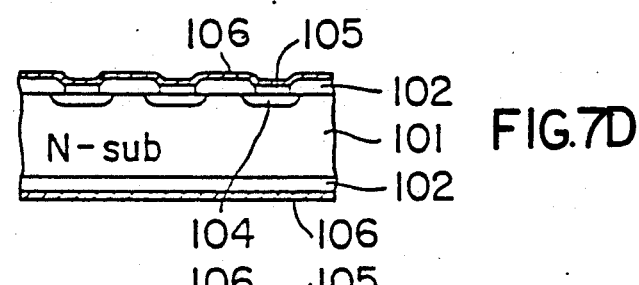
Figure 7E:
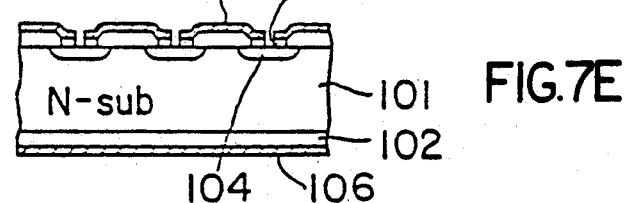
Figure 7F:
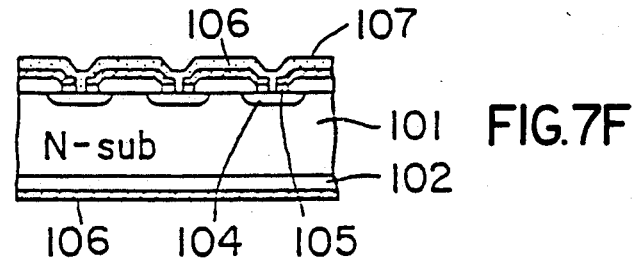
Figure 7G:
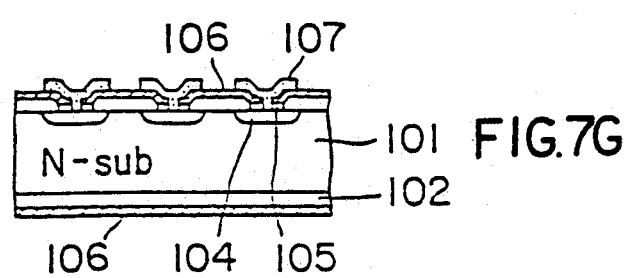

The operation of this detector will be now described with reference to FIGS. 4(a), 4(b), 4(c), 5(a), 5(b), 5(c), 6(a), 6(b), 6(c). FIGS. 4(a), 4(b) and 4(c) show stresses applied to respective resistance elements (the expansion and contraction directions are indicated by + and −, respectively, and no change is indicated by 0) in the case where a force is applied in X-axis direction, FIGS. 5(a), 5(b), and 5(c) show stresses similar to those defined above in the case where a force is applied in Y-axis direction, and FIGS. 6(a), 6(b) and 6(c) show stresses similar to those defined above in the case where a force is applied in Z-axis direction. In respective figures, the cross section cut along X-axis of the detector shown in FIG. 1(b) is labeled (a), the cross section cut along Y-axis thereof is labeled (b), and the cross section parallel to X-axis and cut along elements Rz1 to Rz4 thereof is labeled (c).

Figure 3B:
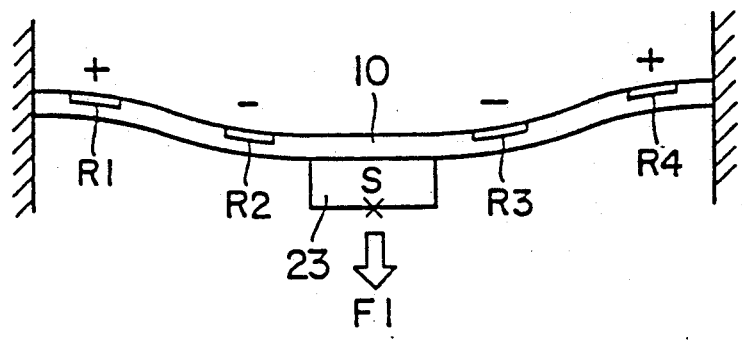
Figure 3C:
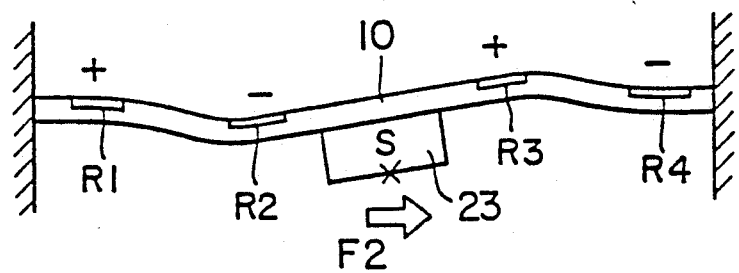

When it is first assumed that a force in X-axis direction as indicated by an arrow Fx (a direction perpendicular to the paper plane in FIG. 4(b)) of FIGS. 4(a), 4(b) and 4(c) is applied, stresses having polarities shown are produced, respectively. The polarities of these stresses will be understood from the explanation of FIGS. 3(a), 3(b), and 3(c). Resistance changes corresponding to stresses are produced in respective resistance elements R. For example, the resistance of resistance element Rx1 is decreased (−), the resistance of resistance element Rx2 is increased (+), and the resistance of resistance element Ry1 is unchanged (0). In addition, when forces in Y- and Z-axis directions as indicated by arrows Fy and Fz in FIGS. 5(a), 5(b) and 5(c) and 6(a), 6(b) and 6(c) are applied, stresses as shown are produced.

Eventually, the relationship between forces applied and changes in respective resistance elements is listed as shown in Table 1.

TABLE 1

|     | Fx | Fy | Fz |
| --- | --- | --- | --- |
| Rx1 | −  | ∘  | −  |
| Rx2 | +  | ∘  | +  |
| Rx3 | −  | ∘  | +  |
| Rx4 | +  | ∘  | −  |
| Ry1 | ∘  | −  | −  |
| Ry2 | ∘  | +  | +  |
| Ry3 | ∘  | −  | +  |
| Ry4 | ∘  | +  | −  |
| Rz1 | −  | ∘  | −  |
| Rz2 | +  | ∘  | +  |
| Rz3 | −  | ∘  | +  |
| Rz4 | +  | ∘  | −  |

When the fact that respective resistance elements R constitute bridges as shown in FIGS. 2(a), 2(b) and 2(c) is taken into consideration here, the relationship between applied forces and the presence of changes in respective voltage meters 51 to 53 is as shown in Table 2.

TABLE 2

|  | Fx | Fy | Fz |
| --- | --- | --- | --- |
| Voltage meter 51 | presence | absence | absence |
| Voltage meter 52 | absence | presence | absence |
| Voltage meter 53 | absence | absence | presence |

The resistance elements Rz1 to Rz4 are subjected to substantially the same stress changes as those of the resistance elements Rx1 to Rx4. However, it is to be noted that because both the resistance elements have bridge configuration different from each other, voltage meters 51 and 53 provide different responses. Eventually, the voltage meters 51, 52 and 53 will respond to forces in X-, Y- and Z-axis directions, respectively. It is further to be noted that although only the presence of changes is indicated in Table 2, the polarity of changes is ruled by an applied force and a quantity of changes is ruled by the magnitude of an applied force.

§2 Manufacturing of a Resistance Element Having a Piezo Resistance Effect

2.1 Manufacturing Process

An example of a method of manufacturing a resistance element will be now described with reference to the various steps (a)–(g) shown in FIG. 7. This resistance element has piezo resistance effect and is formed by the semiconductor planar process on a semiconductor substrate. Initially, as shown in step (a) of FIG. 7, an N-type silicon substrate 101 is subjected to thermal oxidation, thus to form a silicon oxide layer 102 thereon. Then, as shown in step 7(b), the silicon oxide layer 102 is subjected to etching by photolithographic method to form an opening 103. Subsequently, as shown in step 7(c), boron is thermally diffused from the opening 103, thus to form a P-type diffused region 104. It is to be noted that a silicon oxide layer 105 is formed in the opening 103 by the process of thermal diffusion. Then, as shown in step 7(d), silicon nitride is deposited by CVD method to form a silicon nitride layer 106 as a protective layer. After contact holes are opened in the silicon nitride layer 106 and the silicon oxide layer 105 by the photo-lithographic method as shown in step 7(e), an aluminum wiring layer 107 is formed by vacuum deposition as shown in step 7(f). Finally, patterning is applied to the aluminum wiring layer 107 by the photo-lithographic method to provide a structure as shown in step 7(g).

It is to be noted that the above-described manufacturing process is shown as merely one example and therefore this invention may be realized in principle with any resistance element as long as that resistance element has a piezo resistance effect.

2.2 Selection of Plane Orientation of Single Crystal

Piezo resistance coefficient of a single crystal substrate having such a piezo resistance effect as described above, i.e., electric resistance change sensitivity with respect to stress-strain has a directional dependency. Accordingly, measurement sensitivity is greatly influenced by plane orientation in cutting the single crystal substrate. One feature of this invention resides in selection of a direction having the most excellent sensitivity as a detection axis. As shown in FIG. 1(b), resistance elements Rx1 to Rx4 are arranged on X-axis and resistance elements Ry1 to Ry4 are arranged on Y-axis. Since X-axis and Y-axis are perpendicular to each other, it is understood to provide two detection axes perpendicular to each other on the resistance element formation plane. If the peak resistance coefficient takes a peak value in the detection axis directions perpendicular to each other, i.e., X- and Y-axis directions in FIG. 1(b), high accuracy measurement having a very excellent sensitivity can be made. Such a condition is satisfied by conducting cutting of a single crystal substrate along a plane such that peak directions of the piezo resistance coefficients are perpendicular to each other.

Figure 8A:
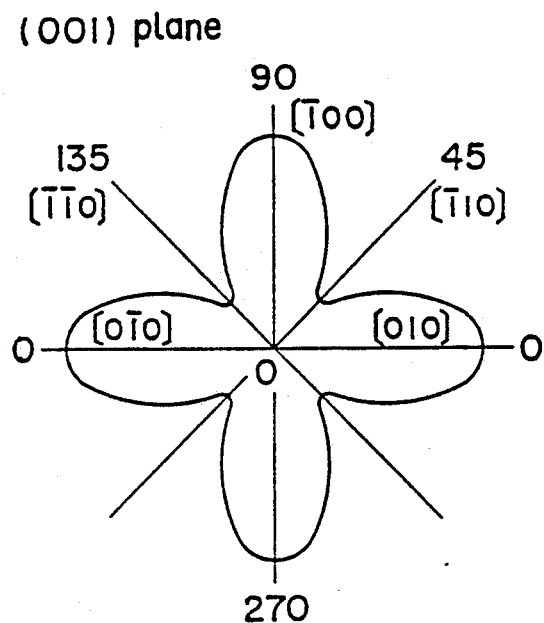
FIGS. 8(a), 8(b) and 8(c) are graphs showing piezo resistance coefficients in respective planes of a silicon single crystal.
Figure 8B:
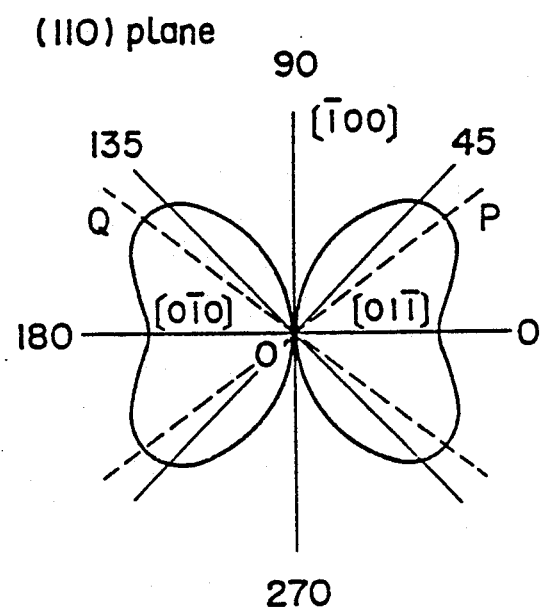
Figure 8C:
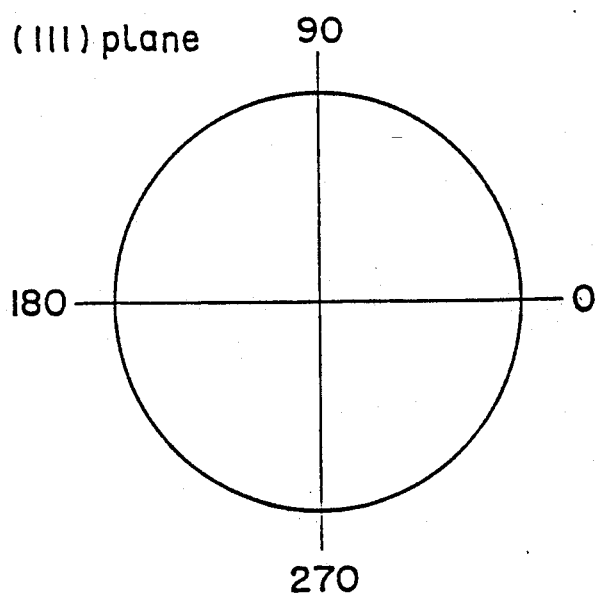

Examples of plane orientations of piezo resistance coefficients are shown as graphical representations in FIGS. 8(a) to 8(c). In this graph, piezo resistance coefficients for respective directions within a cut plane obtained by cutting a single crystal of silicon at a specified crystal face are plotted in correspondence with distances from the origin O. FIGS. 8(a) to 8(c) are graphs showing measured results in regard to (001) plane, (110) plane, and (111) plane, respectively.

For example, in (001) plane, piezo resistance coefficient takes a peak value in respective directions of 0, 90, 180 and 270 degrees shown in FIG. 8(a). Namely, the directions which exhibit peak are perpendicular to each other within a plane. This satisfies the condition of this invention. Therefore, by using [010] and [100] directions as X- and Y-axis directions of the device shown in FIG. 1(b), respectively, measurement having an excellent sensitivity will be conducted.

On the contrary, for example, in (110) plane, piezo resistance coefficient takes a peak value in the direction indicated by broken lines in FIG. 8(b). Because the angle POQ is not right-angled, it is impossible to use the direction indicated by broken lines as the X- and Y-axis directions of the device shown in FIG. 1(b). For conducting a measurement with a good sensitivity as far as possible by using this plane, for example, the direction of 45 degrees and the direction of 135 degrees shown in FIG. 8(b) are used as the X- and Y-axis directions, respectively. However, this results in the fact that both axes somewhat deviate from the peak value, thus failing to provide an ideal sensitivity condition.

There exist other cut planes such that the peak directions are perpendicular to each other as shown in FIG. 8(a). Any one of them may be used in this invention. It is to be noted that resistance elements Rz1 to Rz4 for detecting a force in a Z-axis direction are arranged along the X-axis direction. In principle, any direction of these resistance elements may be taken. For example, if an arrangement in a direction of 45 degrees with respect to X-axis is made, it is possible to detect a force in Z-axis direction. However, in the case of forming resistance elements using (001) plane as shown in FIG. 8(a), this is not desirable because the sensitivity of the direction of 45 degrees is extremely bad. Accordingly, it is preferable to arrange such resistance elements in X-axis direction exhibiting high sensitivity as shown in FIG. 1(b). Alternatively, they may be arranged in Y-axis direction for the reason similar to the above.

It is to be noted that measurement having a good sensitivity may be conducted even using a plane such that the piezo resistance coefficient exhibits the peak value in regard to all the directions, e.g., (111) plane etc., as shown in FIG. 8(c). In short, if the resistance element formation plane is selected so that piezo resistance coefficients in two directions substantially perpendicular to each other on the resistance element formation plane exhibit substantially peak values, measurement having a good sensitivity can be conducted.

2.3 Advantages with the force detector according to this invention

Since the device according to this invention uses planar resistance elements formed on a single crystal substrate as described above, its structure is very simplified. Further, since manufacturing thereof can be conducted by a process as described above, such a device is suitable for mass production and cost down thereof can be realized. In addition, since the resistance element used is an element comprised of a single crystal and such that directions in which the piezo resistance coefficient exhibits the peak can be utilized as described above, high accuracy measurement can be carried out.

§3 Most preferred embodiment of the acceleration detector

3.1 Configuration of the detector

Figure 9A:
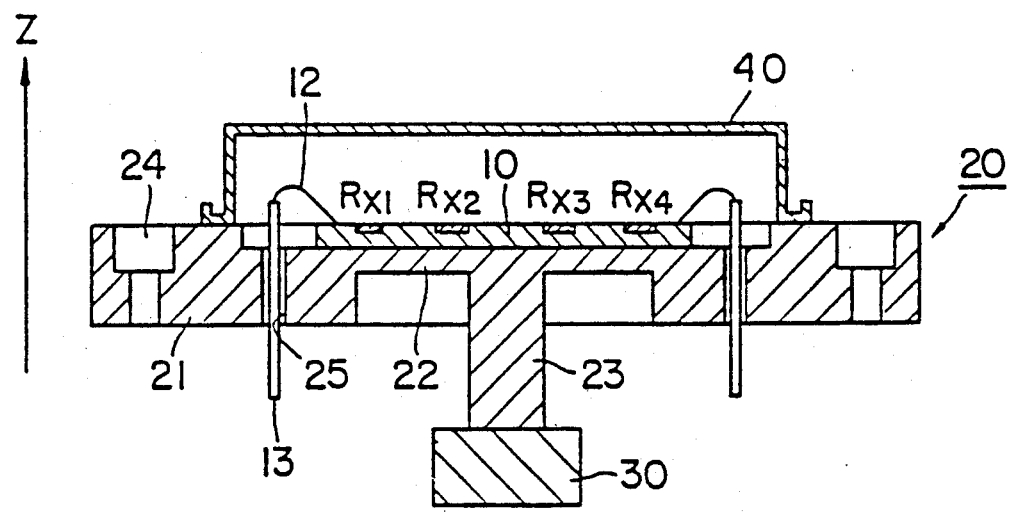
FIGS. 9(a) and 9(b) are a side cross sectional view and a plan view of an acceleration detector according to an embodiment of this invention, respectively.
Figure 9B:
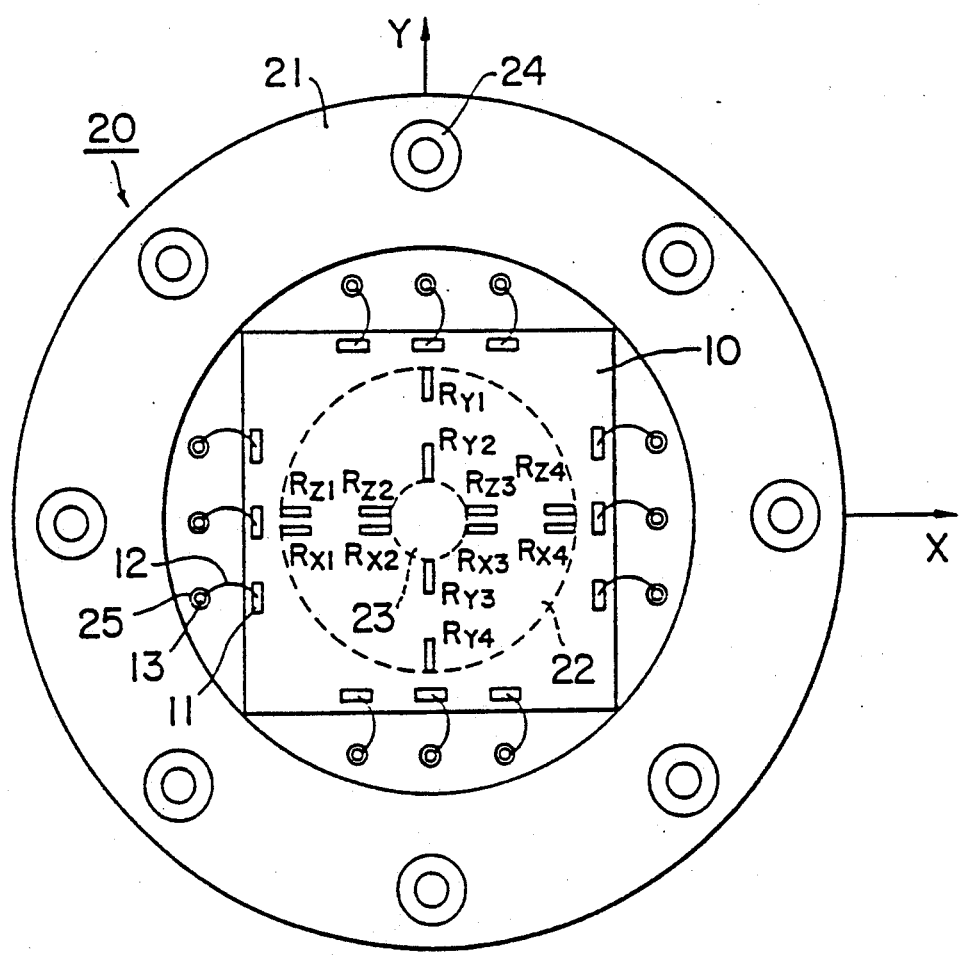

FIG. 9(a) is a side cross sectional view of an acceleration detector according to an embodiment of this invention, and FIG. 9(b) is a plan view of the detector. Here, the same components as those of the force detector shown in FIGS. 1(a) and 1(b) are designated by like reference numerals, respectively.

This acceleration detector differs from the force detector shown in FIGS. 1(a) and 1(b) in that a weight body 30 is provided at the tip portion of the projection 23. In this embodiment, the weight body 30 is comprised of a mass of metal. The weight body 30 has a function to allow the strain generative body 20 to produce stress-strain corresponding to an acceleration applied. As long as a weight body performs such a function, it may be comprised of any material and provided at any position.

The configuration except for the above is completely the same as that of the force detector shown in FIGS. 1(a) and 1(b). To respective resistance elements, wiring for constructing bridge circuits as shown in FIGS. 2(a), 2(b) and 2(c) is implemented.

3.2 Operation of the detector

When the movement of the entirety of the detector is started in FIG. 9(a), an acceleration is applied to the weight body by this movement, so that a stress-strain corresponding to the acceleration is produced in the strain generative body 20. Because the flexible portion 22 has thin thickness and flexibility as described above, a displacement is produced between the central portion (working portion) and the peripheral portion (supporting portion) of the strain generative body. Thus, respective resistance elements R are mechanically deformed. Electric resistances of respective resistance elements R vary by this deformation. Eventually, the acceleration in movement of the entirety of the detector is detected as a change in each bridge voltage shown in FIGS. 2(a), 2(b) and 2(c).

After all, the magnitude and the direction of an acceleration acting on the weight body 30 become in correspondence with the magnitude and the direction of a force acting on the working point S of the force detector shown in FIGS. 1(a) and 1(b), respectively. Accordingly, as forces in three directions acting on the working points S can be independently detected in the force detector shown in FIGS. 1(a) and 1(b), accelerations in three directions acting on the weight body 30 can be independently detected in the acceleration detector shown in FIGS. 9(a) and 9(b).

3.3 Embodiment of the Type Integrally Formed

Figure 10:
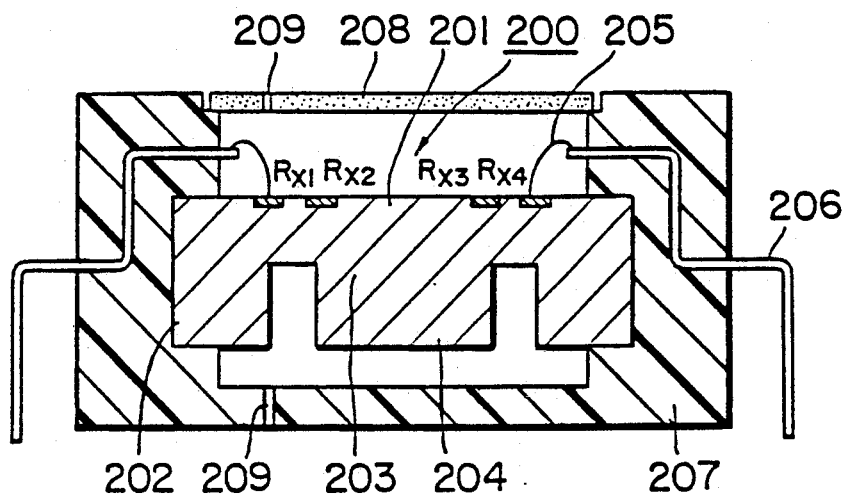
FIGS. 10 and 11 are side cross sectional views of an acceleration detector according to different embodiments of this invention, respectively.

In the above-described embodiment, the semiconductor substrate, the strain generative body and the weight body are made of individual members, respectively, and the entire device is constituted by adhering these members to each other. Instead, all of these members may be integrally formed by the same material. FIG. 10 is a cross sectional view of an embodiment in which such a device is integrally formed with one chip comprised of a silicon single crystal. The silicon chip 200 is shaped as shown, and is composed of a substrate portion 201 on which resistance elements are formed, a supporting portion 202, a working portion 203, and a weight portion 204. The weight portion 204 eventually serves as a weight by the weight of silicon itself. Respective resistance elements are connected to leads 206 by means of bonding wires 205. This silicon chip 200 is sealed by a mold resin 207 and a cover plate is adhered to the upper portion thereof. Ventilation holes 209 are provided in the mold resin 207 and the cover plate 208. This is because if such a device is tightly sealed, the influence of tightly sealing pressure due to changes in temperature appears in the result detected.

It is to be noted that such a silicon chip 200 as shown in FIG. 10 may be manufactured by applying patterning to silicon nitride layer 106 deposited on the back surface further from the state shown in step (j) FIG. 7 to carry out etching using an etchant such as alkali with the silicon nitride layer being as a mask.

Figure 11:
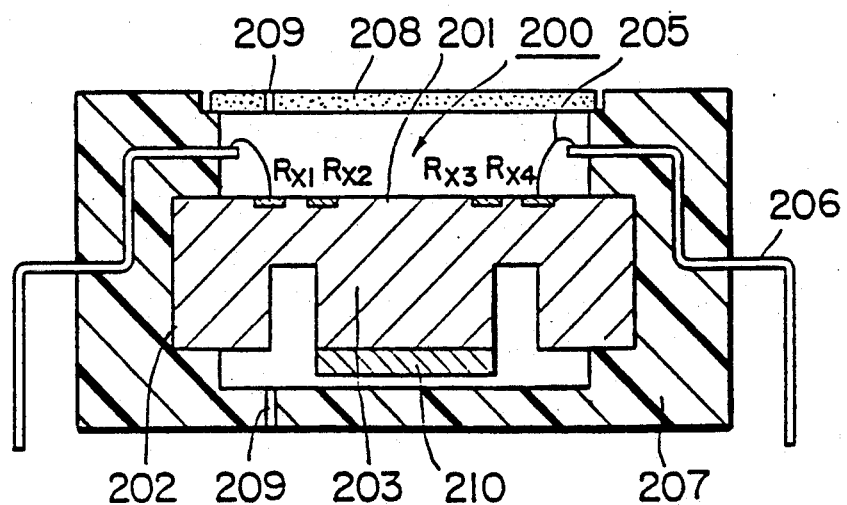

In the embodiment shown in FIG. 11, the semiconductor substrate and the strain generative body are integrally formed with one chip comprised of a silicon single crystal to provide a weight body 210 made of another material at the tip portion of the working portion 203.

§4 Most preferred embodiment of the magnetism detector

4.1 Configuration of the detector

In the acceleration detector shown in FIGS. 9(a) and 9(b), an acceleration acting on the weight body 30 is detected as a force acting on the tip portion of the projection 23. In a magnetism detector described below, a magnetic body is provided in place of weight body to detect, as a force acting on the projection 23, a magnetic force applied when the magnetic body is placed in a magnetic field.

Figure 12A:
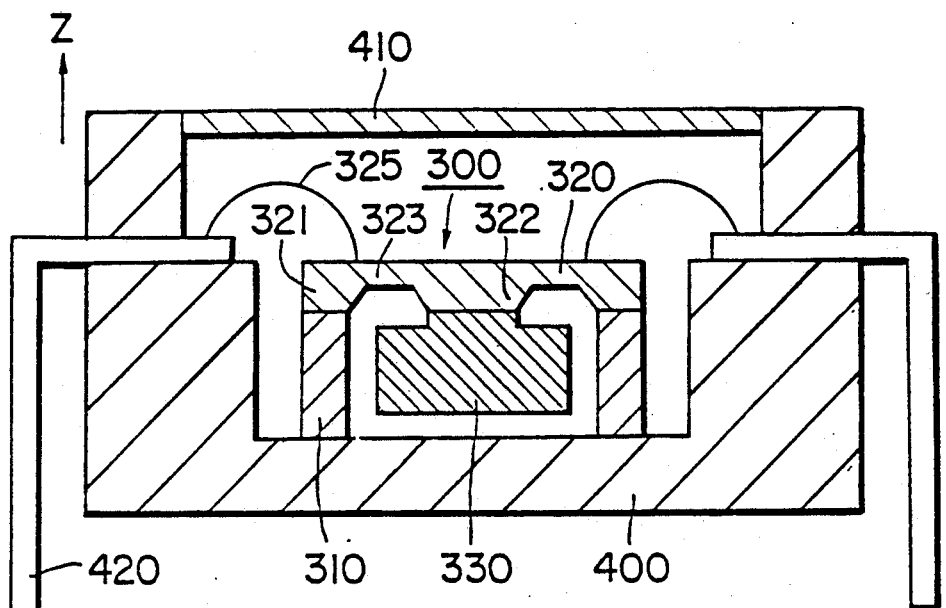
FIG. 12(a) is a side cross sectional view of a magnetism detector according to an embodiment of this invention.
Figure 12B:
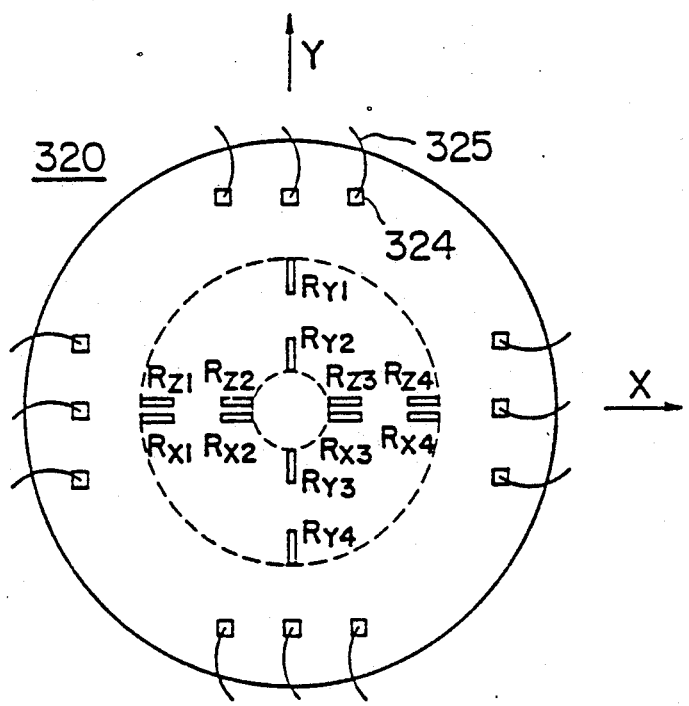
FIG. 12(b) is a top view of a single crystal substrate in the device of FIG. 12(a)

FIG. 12(a) is a side cross sectional view of a magnetism detector according to an embodiment of this invention, and FIG. 12(b) is a top view of a single crystal substrate within this detector. A magnetism detector unit 300 is comprised of a cylindrical pedestal 310, a silicon single crystal substrate 320, and a magnetic body 330. The single crystal substrate 320 comprises a peripheral supporting portion 321, a central working portion 322 and a flexible portion 323 having a thin thickness formed between the supporting portion 321 and the working portion 322 wherein the supporting portion 321 is fixed on the pedestal 310. The material of the magnetic body 330 includes iron, cobalt, or nickel, etc. which is a ferromagnetic material, or alloy thereof (e.g., Kovar, etc.). The magnetic body 330 is such that its periphery is surrounded by the cylindrical pedestal 310. The magnetic body 330 is provided between the magnetic body 330 and the pedestal 310 with an air gap. When placed in a magnetic field, the magnetic body can be subjected to displacement by a magnetic force.

Because the flexible portion 323 of the single crystal substrate 320 has a thin thickness and flexibility, when the magnetic body 330 is subjected to displacement, stress-strain is produced on the surface of the single crystal substrate 320. This stress-strain is detected by resistance elements formed on the single crystal substrate 320. An arrangement of these resistance elements R is shown in FIG. 12(b). This arrangement is completely the same as that of the force detector shown in FIG. 1(b). For respective resistance elements R, bridge circuits as shown in FIGS. 2(a), 2(b) and 2(c) are constructed. Such bridge outputs are taken out to the external by way of bonding wires 325 through bonding pads 324.

The magnetism detector unit 300 is accommodated within a case 400 over which a cover 410 is fitted. Bonding wires 325 are connected to one ends of leads 420. As just described above, the entirety of the device is protected by the case 400. The other ends of the leads are drawn out to the outside, and are used for wiring.

4.2 Operation of the detector

When the magnetism detector shown in FIGS. 12(a) and 12(b) is placed in a magnetic field, the magnetic body 330 is subjected to a magnetic force. The magnetic force that the magnetic body 330 has undergone is transmitted to the working portion 322 of the single crystal substrate 320. Eventually, the magnitude and the direction of the magnetic field in which this detector is placed become in proportion to the magnitude and the direction of the force acting on the working portion 322, respectively. As stated in the description of operation of the above-described force detector, the magnitude and the direction of the force acting on the working portion 322 are obtained from the bridge outputs. The magnitude and the direction of the magnetic field can be detected in this way.

4.3 Cancellation of Acceleration

When used in a static environment where no acceleration is applied, the device shown in FIGS. 12(a) and 12(b) sufficiently functions as a magnetism detector. However, such a device does not make a precise operation in an environment where an acceleration is applied, as in the case where it is embarked on a vehicle. This is because not only a force based on a magnetic force but also a force based on an acceleration are applied to the working portion 322 resulting from the fact that the magnetic body 330 has mass.

Figure 13:
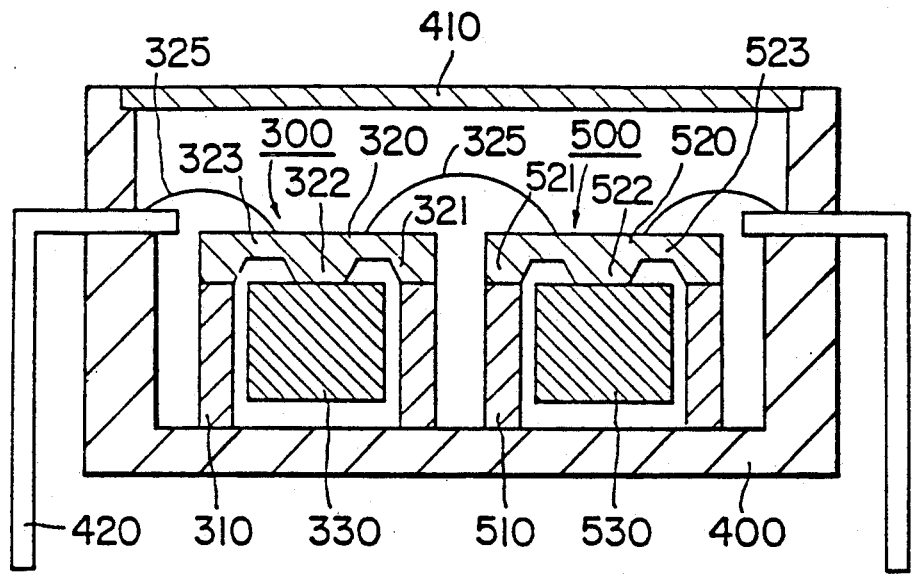
FIG. 13 is a cross sectional view of a magnetism detector having an acceleration cancellation function according to an embodiment of this invention.

The device of which cross section is shown in FIG. 13 additionally has an acceleration cancellation function so as to permit it to be precisely operative even in such an environment where an acceleration is applied. This device includes magnetism detector unit 300 and an acceleration detector unit 500 within the case 400. The acceleration detector 500 has a configuration similar to the magnetism detector 300. Namely, a pedestal 510 is completely the same as the pedestal 310, and a single crystal substrate 520 is completely the same as the single crystal substrate 320, which is composed of a supporting portion 521, a working portion 522, and a flexible portion 523. The sole difference is that a weight body 530 is provided in place of the magnetic body 330. This weight body 530 is comprised of a material having a magnetic property different from that of the magnetic body 330, such as, for example, a glass material. In the case of using a glass material, it is preferable to use borosilicate glass such as Pyrex having substantially the same order of coefficient of linear expansion as that of the single crystal substrate 520.

Since the magnetism detector unit 300 and the acceleration detector unit 500 are both fixed to the case 400 by means of pedestals 310 and 510, respectively, both units are subjected to the same acceleration. In the magnetism detector unit 300, a magnetic force acting on the magnetic body 330 and a force based on an acceleration are both detected. On the contrary, because only an acceleration acts on the weight body in the acceleration detector unit 500, only a force based on the acceleration is detected. Accordingly, it is possible to cancel accelerations using both the values detected.

Figure 14:
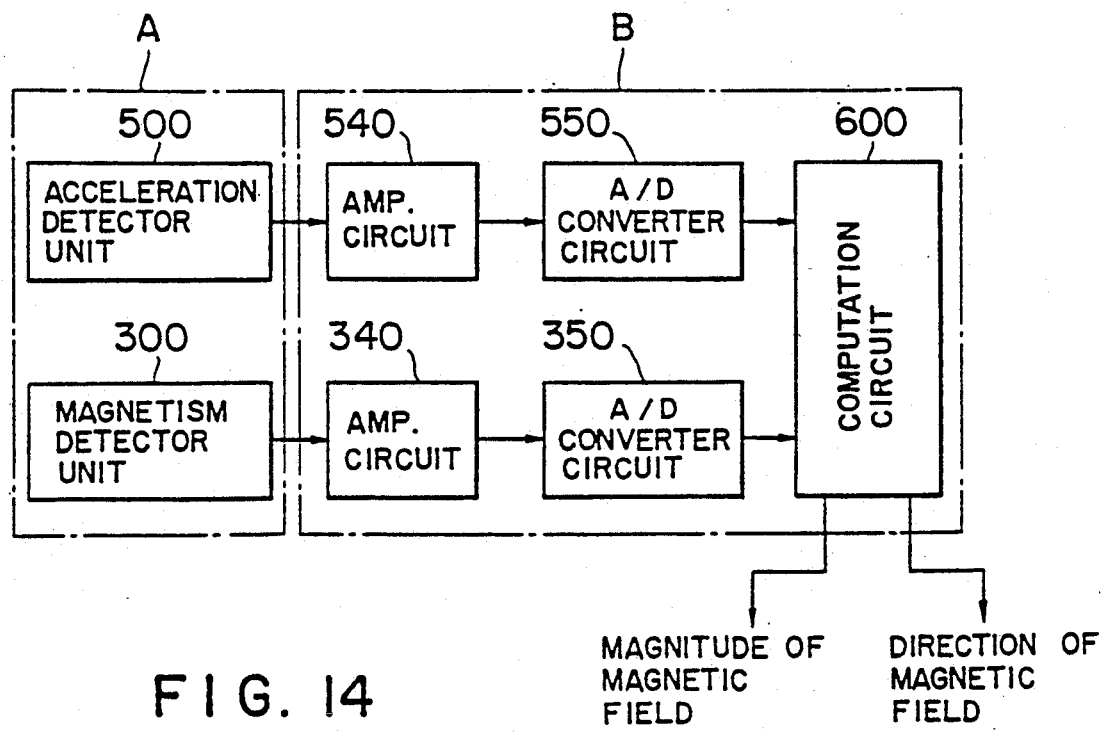
FIG. 14 is a diagram of the circuit configuration for conducting acceleration cancellation in the detector shown in FIG. 13.

A circuit configuration for cancelling accelerations is shown in FIG. 14. Here, block A corresponds to the entirety of the device shown in FIG. 13, and block B corresponds to compensation computation means for cancelling accelerations. Electric signals output from respective bridge circuits of the acceleration detector unit 500 and the magnetism detector unit 300 are amplified so that they have predetermined levels by amplifier circuits 540 and 340, respectively. Then, these signals thus amplified are converted from analog signals to digital signals by A/D converter circuits 550 and 350, respectively. Respective digital signals thus converted are delivered to a computation circuit 600.

When a magnetic force and an acceleration are applied to the entirety of the detector, Ax, Ay and Az are delivered as accelerations every respective components of X-, Y- and Z-axis directions from the A/D converter circuit 550 on the side of the acceleration detector unit 500 to the computation circuit 600. On the other hand, Bx, By and Bz as the direction and the magnitude of a magnetic field, and Ax', Ay' and Az' as accelerations are delivered every components of X-, Y-and Z-axis directions from the A/D converter circuit 350 on the side of the magnetism detector unit 300 to the computation circuit 600. As described above, the weight body 530 and the magnetic body 330 are subjected to the same acceleration wherein when masses of both the bodies are different, the relationships of $Ax = Kx \cdot Ax'$, $Ay = Ky \cdot Ay'$ and $Az = Kz \cdot Az'$ hold, where Kx, Ky and Kz are constants, respectively. On the basis of these relationships, the computation circuit 600 performs a computation to cancel acceleration components from signals output from the magnetism detector unit 300 and the acceleration detector unit 500. Because Kx, Ky and Kz become equal to 1 when the mass of the weight body 530 is set to a value equal to the mass of the magnetic body 330, cancellation computation of the acceleration components becomes extremely simple. Even when masses of both the bodies are different, cancellation computation can be performed if constants Kx, Ky and Kz are known. Thus, the precise direction and the magnitude of the magnetic field which are not influenced by the acceleration are detected.

It is needless to say that when an output from the acceleration detector unit 500 is used as it is, this device may be used as an acceleration detector Although it has been described that accelerations produced in the weight body 530 for detecting acceleration and in the magnetic body 330 for detecting magnetism are the same, it is not necessarily required that both the accelerations are the same. For example, in the case of constituting only the pedestal 510 of the acceleration detector unit 530 with a rubber material having resilient property, accelerations Ax', Ay' and Az' produced in the magnetic body 330 and accelerations Ax", Ay" and Az" produced in the weight body 530 are different from each other. In this case, accelerations Ax", Ay" and Az" produced in the weight body 530 are expressed as $Ax'' = f(a_1) \cdot Ax'$, $Ay'' = f(a_2) \cdot Ay'$, and $Az'' = f(a_3) \cdot Az'$. Here, $f(a_1)$, $f(a_2)$ and $f(a_3)$ are determined by the mechanical property of the pedestal and accelerations Ax', Ay' and Az'. From the above equations, accelerations Ax', Ay' and Az' produced in the magnetic body 330 are calculated. Then, by cancelling accelerations Ax', Ay' and Az' from a signal output from the magnetism detector unit 300, it is possible to detect precise magnitude and direction of the magnetic field which are not influenced by the accelerations.

While the weight body 530 of the acceleration detector unit 500 is comprised of glass material in the above-described embodiment, the weight body 530 may be comprised of a magnetic material of which magnetic property is different from that of the magnetic body 330. Where the weight body 530 is also comprised of a magnetic material, the acceleration detector unit detects not only acceleration but also magnetic force. Thus, the acceleration detector unit substantially functions as a magnetism detector unit. Eventually, two kinds of detection signals are obtained from two magnetism detector units. However, even in such a case, as long as a material of which magnetic property is different from that of the magnetic body 330 is used as the material of the weight body 530, it is possible to perform a compensation computation for cancelling accelerations from both detection signals. For allowing the compensation computation to be simple, it is preferable to use glass like non-magnetic material for the weight body 530 as in the above-described embodiment.

§5 Protective Structure of the Single Crystal Substrate

Several embodiments of the acceleration detector and the magnetism detector have been disclosed. In these devices, weight body or magnetic body will be subjected to displacement when acceleration or magnetic force is applied thereto. In the event that a quantity of such a displacement exceeds above a predetermined limit, there is the possibility that the single crystal substrate may be broken. Examples of structure for protecting the single crystal substrate from such an excessive displacement will be shown. It is to be noted that while the following examples all show the protective structure for the magnetism detector for convenience of explanation, such protective structure may be applied to the acceleration detector as it is entirely, and may be further applied to the force detector.

5.1 First Embodiment

Figure 15:
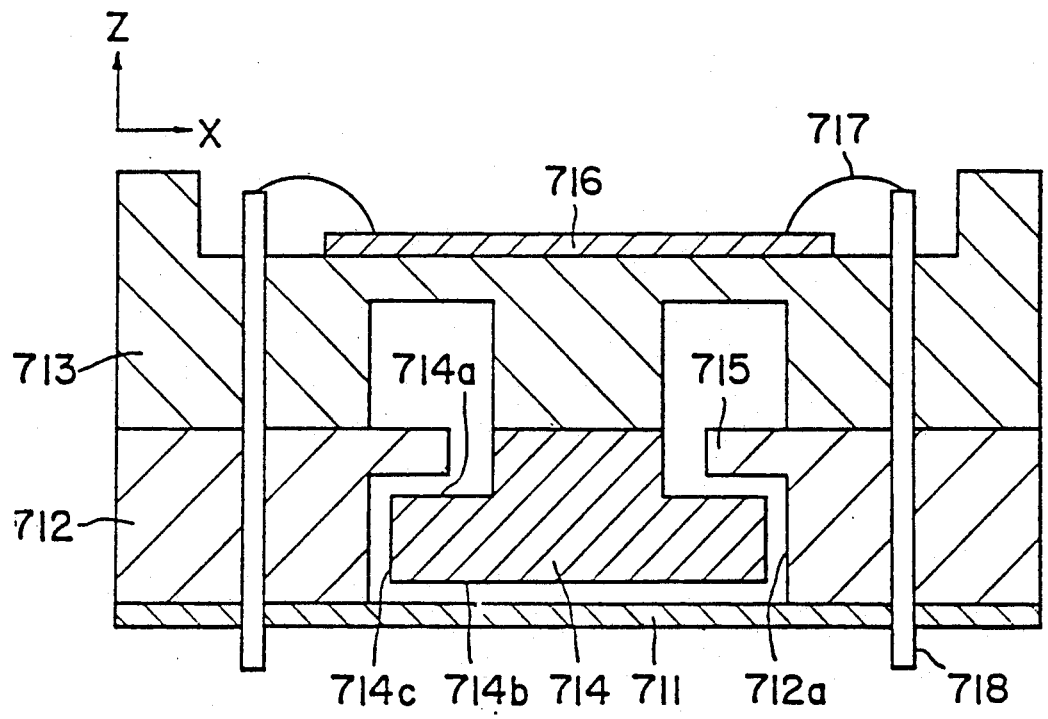
FIGS. 15 to 18 are views showing the single crystal substrate protective structure in the acceleration or magnetism detector according to this invention.

The side cross sectional view of a first embodiment is shown in FIG. 15. In this device, a strain generative body 713 is supported by a pedestal 712 fixed on a fixed or stationary portion 711. A magnetic body 714 is fixed to the central portion of the strain generative body 713, and the magnetic body 714 is fitted into the pedestal 712. Namely, the magnetic body 714 is annular and is inverse T-shaped in its cross section. The upper circumferential end surface 714a of circumferential end surfaces of the magnetic body 714 protruded in a horizontal direction is opposite to an upper protrusion 715 defining a recessed portion of the pedestal 712 with a space being therebetween. On the other hand, lower circumferential end surface 714b of the magnetic body 714 is opposite to the fixed portion 711 with a space being therebetween. Further, the outer circumferential surface 714c of the magnetic body 714 is opposite to inner wall 712a defining a recessed portion of the pedestal 712 with a space being therebetween. A single crystal substrate 716 is adhered to the upper surface of the strain generative body 713 and is wired to electrodes 718 through bonding wires 717.

In accordance with such a construction, when the magnetic body 714 undergoes a magnetic force, the magnetic body 714 is subjected to displacement. However, displacements of X- and Y-axis (perpendicular to the plane of the paper) directions are limited by the inner wall 712a of the pedestal 712, and displacement in Z-axis direction is limited by the upper protrusion 715 of the pedestal 712 and the fixed portion 711. Accordingly, there is no possibility that the magnetic body is excessively subjected to displacement, so that the single crystal substrate 716 is broken.

5.2 Second embodiment

Figure 16:
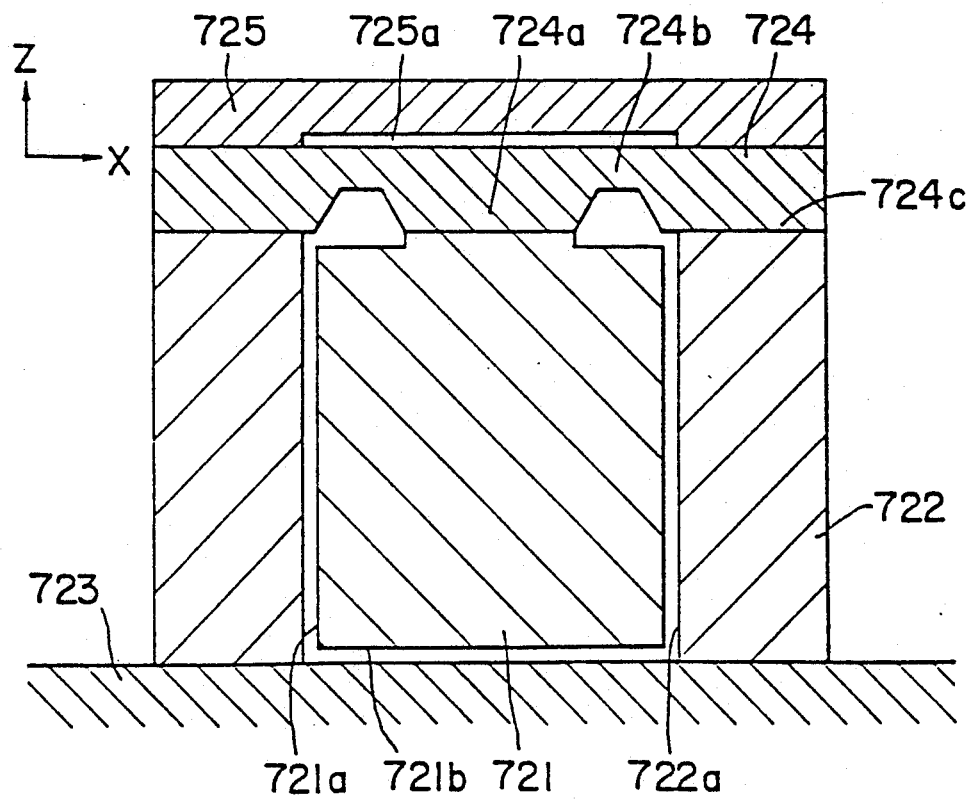

A side cross sectional view of a second embodiment is shown in FIG. 16. In this example, the outer circumferential surface 721a of a magnetic body 721 is opposite to an inner wall 722a of a tubular pedestal 722 with a space being therebetween, and the lower circumferential end surface 721b of the magnetic body 721 is opposite to a fixed portion 723 with a space being therebetween. A single crystal substrate 724 constitutes a strain generative body by itself, and comprises a working portion 724a, a flexible portion 724b, and a supporting portion 724c. Onto the upper surface thereof, an upper plate 725 having a gap 725a opposite to the inside region by the flexible portion 724b is fixed.

Displacements in X- and Y-axis (perpendicular to the plane of the paper) when the magnetic body 721 undergoes a magnetic force are limited by the inner wall 722a of the pedestal 722, and displacement in Z-axis direction is limited by the fixed portion 723 and the upper plate 725 having gap 725a.

5.3 Third embodiment

Figure 17:
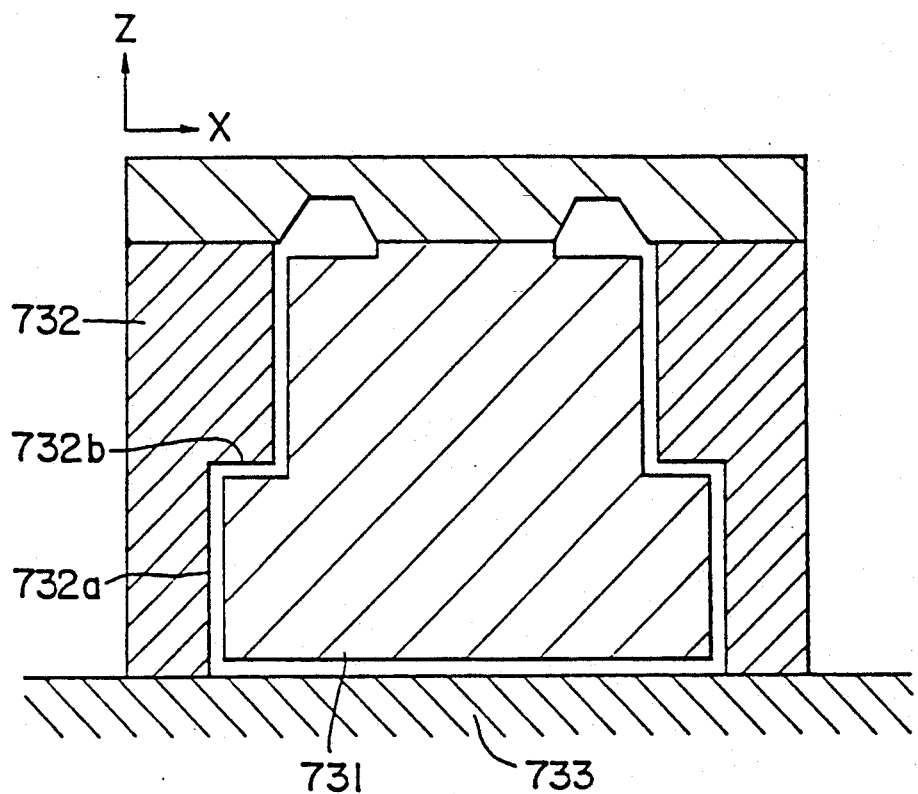

A side cross sectional view of a third embodiment is shown in FIG. 17. Also in this case, displacements in X-and Y-axis (perpendicular to the plane of paper) directions when the magnetic body 731 undergoes a magnetic force are limited by the inner wall 732a of the pedestal 732, and displacement in Z-axis direction is limited by the upper protrusion 732b and the fixed portion 733.

5.4 Fourth embodiment

Figure 18:
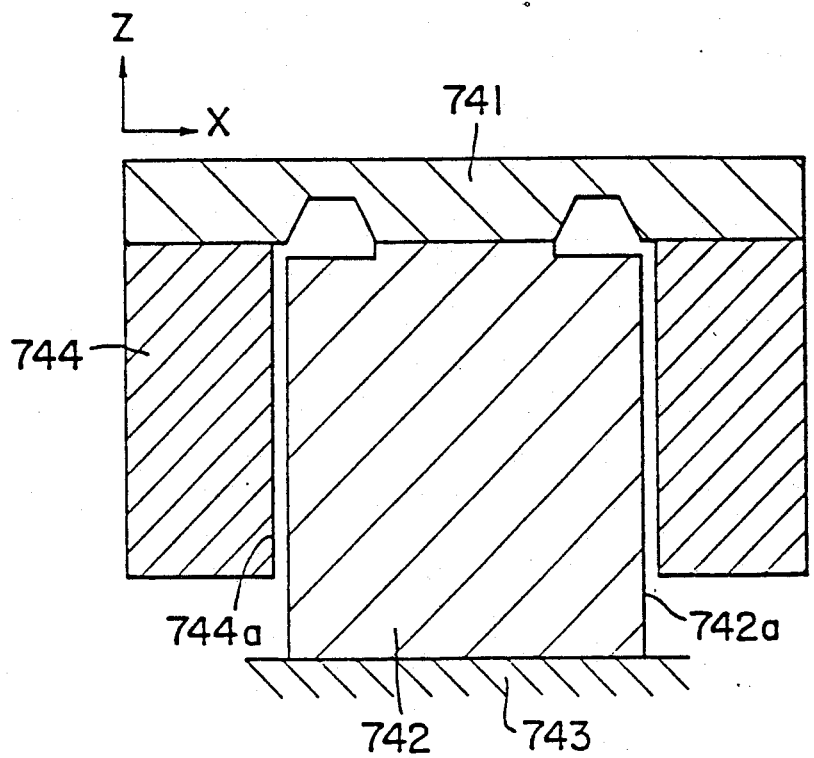

A fourth embodiment is shown in FIG. 18. In this example, the upper surface of a pedestal 742 is fixed to the central portion of a single crystal substrate 741 and the lower surface of the pedestal 742 is fixed to a fixed portion 743. A tubular magnetic body 744 is fixed to the outer circumferential portion of the single crystal substrate 741. The inner wall 744a of the magnetic body 744 and the outer circumferential surface 742a of the pedestal 742 are opposite to each other with a space being therebetween. In this example, displacements in X-and Y-axis (perpendicular to the plane of the paper) when the magnetic body 744 has undergone a magnetic force are limited by the outer circumferential surface 742a of the pedestal 742.

UTILIZABILITY IN INDUSTRY

Detectors for force, acceleration and magnetism according to this invention can be utilized in a form such that they are embarked or loaded on every industrial machine. Since they are small-sized and low in cost, and permit high accuracy measurement, especially application to automotive vehicles or industrial robots will be expected.

I claim:
1. A magnetism detector for detecting magnetism in at least two axial directions in a three-dimensional coordinate system expressed by three axes of X, Y and Z, the detector comprising:
   a single crystal substrate having a surface extending along an XY-plane, at least four resistance elements which have a piezo resistance effect such that electric resistance varies due to mechanical deformation of said surface,
   a strain generative body having a supporting portion and a working portion, said working portion being displaceable with respect to said supporting portion so as to produce a mechanical deformation of said supporting portion, and a magnetic body connected to said working portion so as to allow said working portion to undergo a displacement in response to a magnetic force to which said magnetic body is exposed for mechanically deforming said supporting portion, said substrate being mechanically connected to said supporting portion so that a mechanical deformation of said supporting portion is transmitted to said substrate, and a bridge circuit being formed by said four resistance elements for detecting said magnetic force in each of two of said axial directions, respectively.

2. A magnetism detector comprising:
(1) first detector means comprising:
a single crystal substrate having a resistance element which has a piezo resistance effect such that electric resistance varies due to mechanical deformation, a strain generative body having a supporting portion and a working portion, said working portion being displaceable with respect to said supporting portion so as to produce a mechanical deformation of said strain supporting portion, and a magnetic body connected to said working portion so as to allow said working portion to undergo a displacement in response to a magnetic force to which said magnetic body is exposed, said substrate being mechanically connected to said supporting portion so that a mechanical deformation of said supporting portion is transmitted to said substrate, (2) second detector means comprising:
a single crystal substrate having a resistance element which has a piezo resistance effect such that electric resistance varies due to mechanical deformation, a strain generative body having a supporting portion and a working portion, said working portion being displaceable with respect to said supporting portion so as to produce a mechanical deformation of said supporting portion, and a weight body connected to said working portion so as to allow said working portion to undergo a displacement corresponding to an applied acceleration, and being made of a material of different magnetic properties from that of said magnetic body, said substrate being mechanically connected to said supporting portion so that a mechanical deformation of said supporting portion is transmitted to said substrate, and (3) compensation computation means for inputting a change in a resistance value of said resistance element of said first detector means and a change in a resistance value of said resistance element of said second detector means as first and second data, respectively, to cancel influence of an acceleration of said magnetic body on the basis of said both data, thus to calculate only a magnetic force acting on said magnetic body.

3. A magnetism detector as set forth in claim 2, wherein said first detector means includes at least four resistance elements for detecting a force responsive to the magnetism in at least two axial directions in a three-dimensional coordinate system, and said second detector means includes at least four resistance elements for detecting a force resulting from an acceleration in said axial directions.

4. A magnetism detector for detecting magnetism in at least two axial directions in a three-dimensional coordinate system expressed by three axes of X, Y and Z, the detector comprising:

a single crystal substrate having a surface extending along an XY-plane, at least four resistance elements which have a piezo resistance effect such that electric resistance varies due to a mechanical deformation of said surface, said substrate having a supporting portion and a working portion, said working portion being displaceable with respect to said supporting portion so as to produce a mechanical deformation of said substrate, and a magnetic body connected to said working portion so as to allow said working portion to undergo a displacement in response to a magnetic force to which said magnetic body is exposed, and a bridge circuit being formed by said four resistance elements for detecting said magnetic force in each of two of said axial directions, respectively.

5. A magnetism detector comprising:
(1) first detector means comprising:
a single crystal substrate having a resistance element which has a piezo resistance effect such that electric resistance varies due to mechanical deformation, said substrate having a supporting portion and a working portion, said working portion being displaceable with respect to said supporting portion so as to produce a mechanical deformation of said substrate, and a magnetic body connected to said working portion so as to allow said working portion to undergo a displacement in response to a magnetic force to which said magnetic body is exposed, (2) second detector means comprising:
a single crystal substrate having a resistance element which has a piezo resistance effect such that electric resistance varies due to mechanical deformation, said substrate having a supporting portion and a working portion, said working portion being displaceable with respect to said supporting portion so as to produce a mechanical deformation of said substrate, and a weight body connected to said working portion so as to allow said working portion to undergo a displacement corresponding to an applied acceleration, and being made of a material of different magnetic properties from that of said magnetic body, and (3) compensation computation means for inputting a change in a resistance value of said resistance element of said first detector means and a change in a resistance value of said resistance element of said second detector means as first and second data, respectively, to cancel influence of an acceleration of said magnetic body on the basis of said both data, thus to calculate only a magnetic force acting on said magnetic body.

6. A magnetism detector as set forth in claim 5, wherein said first detector means includes at least four resistance elements for detecting a force responsive to the magnetism in at least two axial directions in a three-dimensional coordinate system, and said second detector means includes at least four resistance elements for detecting a force resulting from an acceleration in said axial directions.

* * * * *